(12) United States Patent
Sakaguchi (10) Patent No.: US 10,496,118 B2
(45) Date of Patent: Dec. 3, 2019

(54) VOLTAGE REGULATOR

(71) Applicant: ABLIC Inc., Chiba (JP)

(72) Inventor: Kaoru Sakaguchi, Chiba (JP)

(73) Assignee: ABLIC Inc., Chiba (JP)

( * ) Notice: Subject to any disclaimer, the term of this patent is extended or adjusted under 35 U.S.C. 154(b) by 0 days.

(21) Appl. No.: 16/351,521

(22) Filed: Mar. 13, 2019

(65) Prior Publication Data

US 2019/0286182 A1 Sep. 19, 2019

(30) Foreign Application Priority Data

Mar. 15, 2018 (JP) ................................ 2018-047824

(51) Int. Cl.
*G05F 1/10* (2006.01)
*G05F 1/575* (2006.01)
*H03F 3/45* (2006.01)

(52) U.S. Cl.
CPC ......... *G05F 1/575* (2013.01); *H03F 3/45269* (2013.01); *H03F 3/45273* (2013.01)

(58) Field of Classification Search
CPC ............................. G05F 1/575; H03F 3/45269
USPC ........ 323/269, 271–276, 282–288, 312, 315, 323/316
See application file for complete search history.

(56) References Cited

U.S. PATENT DOCUMENTS

| 5,545,970 | A | * | 8/1996 | Parkes, Jr. | ............... | G05F 1/573 323/273 |
| 5,867,015 | A | * | 2/1999 | Corsi | ...................... | G05F 3/242 323/316 |
| 7,728,569 | B1 | * | 6/2010 | Le | ............................ | G05F 1/575 323/280 |
| 8,957,659 | B2 | * | 2/2015 | Fujimura | ................. | G05F 1/575 323/285 |
| 2002/0130646 | A1 | | 9/2002 | Zadeh et al. | | |
| 2005/0231180 | A1 | | 10/2005 | Nagata et al. | | |
| 2008/0169795 | A1 | * | 7/2008 | Wang | ...................... | G05F 1/575 323/280 |
| 2009/0066306 | A1 | | 3/2009 | Noda | | |
| 2012/0161734 | A1 | | 6/2012 | Wu | | |
| 2014/0117958 | A1 | | 5/2014 | Price et al. | | |
| 2015/0234404 | A1 | | 8/2015 | Agarwal et al. | | |
| 2017/0315574 | A1 | | 11/2017 | Brown et al. | | |

FOREIGN PATENT DOCUMENTS

JP    H03158912    7/1991

OTHER PUBLICATIONS

"Search Report of Europe Counterpart Application", dated Jul. 25, 2019, pp. 1-10.

* cited by examiner

*Primary Examiner* — Rajnikant B Patel
(74) *Attorney, Agent, or Firm* — JCIPRNET (57) ABSTRACT

A voltage regulator includes an error amplifier, and the error amplifier includes a differential pair constituted by a pair of transistors, a current adjustment circuit that provides a bias current proportional to an output current supplied from an output transistor to the differential pair, a source output circuit and a sink output circuit that provide a current based on a current flowing through the differential pair to an output terminal of the error amplifier, and a phase compensation circuit that controls a current of the sink output circuit based on a current of the current adjustment circuit.

3 Claims, 6 Drawing Sheets

PRIOR ART

FIG. 6

VOLTAGE REGULATOR

CROSS REFERENCE TO RELATED APPLICATIONS

This application claims the priority benefit of Japanese Patent Application No. 2018-047824, filed on Mar. 15, 2018. The entirety of the above-mentioned patent application is hereby incorporated by reference herein and made a part of this specification.

BACKGROUND OF THE INVENTION

Technical Field

The invention relates to a voltage regulator.

Description of Related Art

A voltage regulator having an adaptive bias function for changing a bias current of an error amplifier according to an output current of an output transistor is known in prior art.

Figure 6:
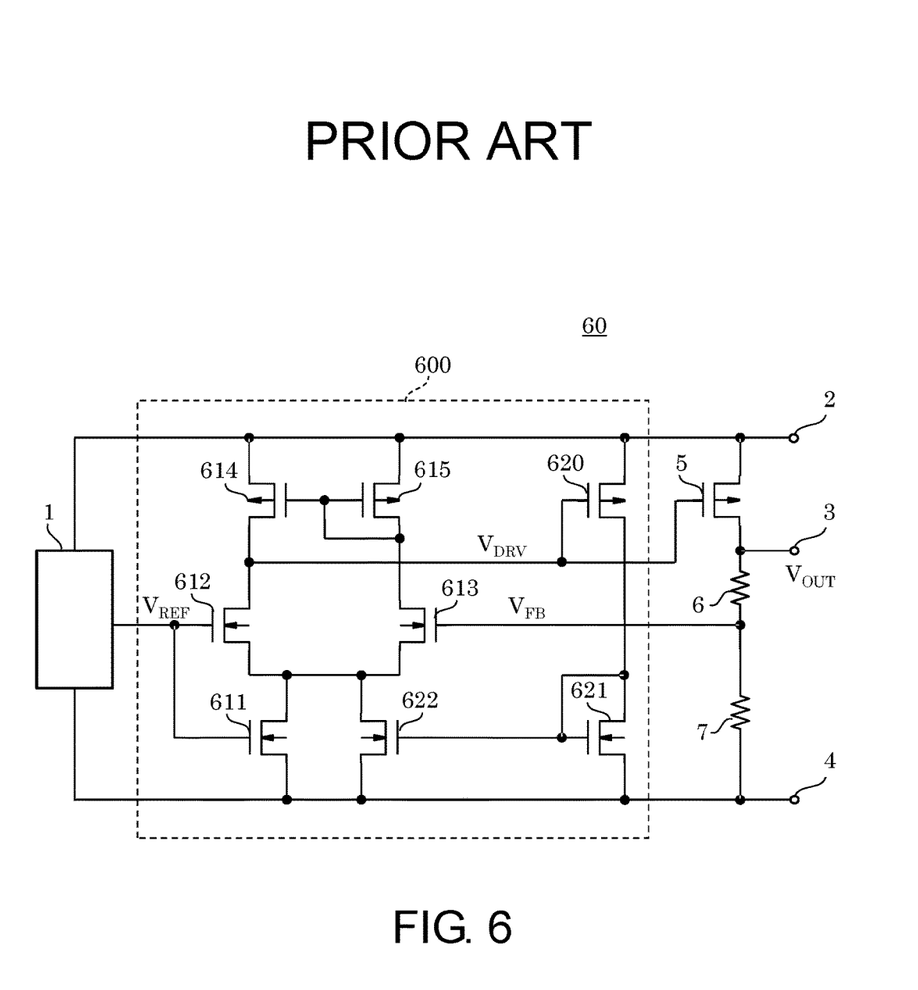
FIG. 6 is a circuit diagram illustrating a voltage regulator in prior art.

FIG. 6 illustrates a circuit diagram of a conventional voltage regulator having an adaptive bias function. An error amplifier 600 of the conventional voltage regulator 60 includes transistors 612 and 613 which are a differential pair, transistors 614 and 615, a transistor 611 which is a bias current source, a transistor 620 which senses an output current, and transistors 621 and 622 constituting a current adjustment circuit.

In the conventional voltage regulator 60, the error amplifier 600 controls a gate of an output transistor 5 with a voltage $V_{DRV}$ obtained by amplifying a difference between a reference voltage $V_{REF}$ and a feedback voltage $V_{FB}$ obtained by dividing an output voltage $V_{OUT}$ of an output terminal 3 by resistors 6 and 7, thereby providing a constant output voltage $V_{OUT}$. The error amplifier 600 includes the transistor 620 that provides a current corresponding to an output current $I_{OUT}$, and a mechanism that changes a bias current according to the output current $I_{OUT}$ via the current adjustment circuit. With such a mechanism, regarding a small output current $I_{OUT}$, a current flowing through the error amplifier 600 is suppressed to achieve lower current consumption, whereas a current proportional to the output current $I_{OUT}$ is generated to flow to the error amplifier 600 to increase a slew rate of the error amplifier 600, thereby realizing a high load transient response (for example, Japanese Patent Application Laid-Open No. 3-158912).

However, in the voltage regulator illustrated in FIG. 1 of Japanese Patent Application Laid-Open No. 3-158912, an operation of the voltage regulator may become unstable due to the current adjustment circuit.

The voltage $V_{DRV}$ at the gate of the output transistor 5, whose change is supplied to a transistor 613 of the error amplifier 600 as a feedback voltage $V_{FB}$ via the output transistor 5 and the resistors 6 and 7, is controlled by an output voltage of the error amplifier 600 again (referred to as the first feedback loop). On the other hand, a change in the voltage $V_{DRV}$ changes a bias current of the error amplifier 600 by the current adjustment circuit including the transistors 620, 621, and 622, and is fed back to the gate of the output transistor 5 by a source current flowing from the input terminal 2 via the transistor 614 and by a sink current flowing to a reference terminal 4 via the transistor 612 (referred to as the second feedback loop).

Here, frequency characteristics of the second feedback loop when the feedback loop is disconnected at the output terminal of the error amplifier 600 are considered. A change in the source current flowing to the output terminal of the error amplifier 600 with respect to the change in the voltage $V_{DRV}$ delays because a pole frequency of a gate of the transistor 614 becomes low due to a Miller effect. On the other hand, a change in the sink current flowing from the output terminal of the error amplifier 600 does not delay because the change is not influenced by the pole. At a frequency equal to or higher than the pole frequency of the gate of the transistor 614, contribution of the sink current therefore becomes dominant in the signal that is fed back to the output terminal of the error amplifier 600 with respect to the change in the voltage $V_{DRV}$.

Since increase of the sink current decreases the voltage $V_{DRV}$ and increases a current through the transistor 620, the current through the transistor 612 increases via a current mirror circuit and the sink current also increases. That is, the second feedback loop carries out a positive feedback at a frequency equal to or higher than the pole frequency of the gate of the transistor 614.

For example, when a gain of the first feedback loop decreases due to a contribution of a pole in a low frequency region generated at the output terminal 3, etc., a contribution of a positive feedback signal from the second feedback loop cannot be ignored. In such a case, stability of the voltage regulator suddenly deteriorates, and deterioration of a phase margin and start of oscillation are likely to occur. This is a specific phenomenon for a voltage regulator including an adaptive bias mechanism.

SUMMARY OF THE INVENTION

The present invention provides a voltage regulator capable of avoiding instability caused by a current adjustment circuit while realizing low current consumption and high load transient response characteristics.

According to one embodiment of the present invention, a voltage regulator is provided. The voltage regulator includes an error amplifier for controlling an output transistor so that a feedback voltage based on an output voltage is consistent with a reference voltage. The error amplifier includes a differential pair constituted from a pair of transistors; a current adjustment circuit that provides a bias current to the differential pair in which the bias current is proportional to an output current provided from the output transistor; a source output circuit and a sink output circuit that provide a current based on a current flowing through the differential pair to an output terminal of the error amplifier; and a phase compensation circuit that controls a current of the sink output circuit based on a current of the current adjustment circuit.

According to one embodiment of the present invention, since a contribution of the positive feedback signal generated in the feedback loop of the current adjustment circuit is lowered or canceled by the phase compensation circuit connected between the current adjustment circuit and the sink output circuit, it is possible to obtain a stable adaptive bias voltage regulator while realizing low current consumption and high load transient response characteristics.

DESCRIPTION OF THE EMBODIMENTS

Hereinafter, embodiments of the present invention will be described with reference to the drawings.

Figure 1:
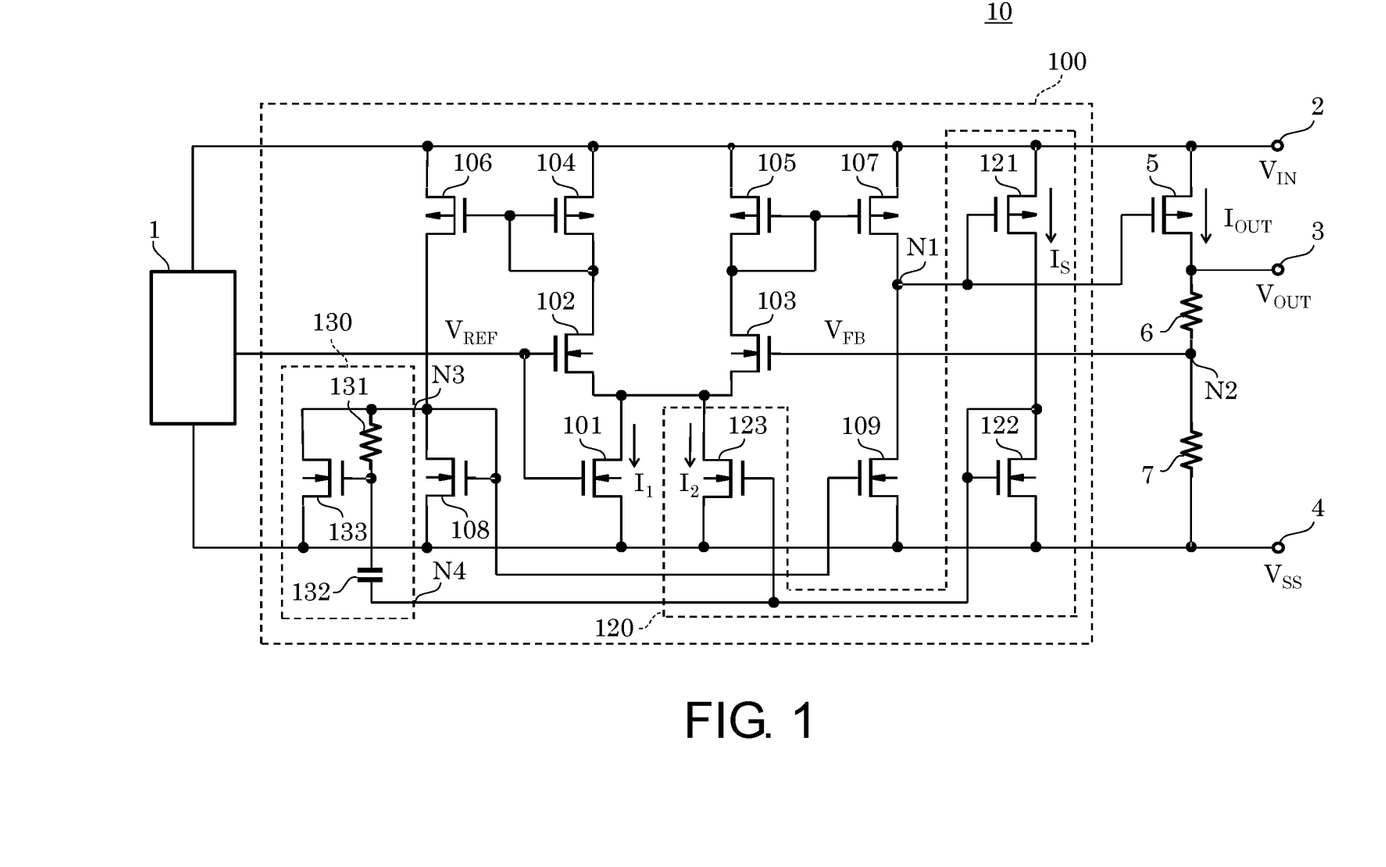
FIG. 1 is a circuit diagram illustrating a voltage regulator according to an embodiment of the invention.

FIG. 1 is a circuit diagram illustrating a voltage regulator 10 according to an embodiment of the present invention.

The voltage regulator 10 includes a reference voltage circuit 1, an input terminal 2, an output terminal 3, a reference terminal 4, an output transistor 5, resistors 6 and 7 forming a feedback circuit, and an error amplifier 100.

The error amplifier 100 includes NMOS transistors 101, 102, 103, 108, and 109, PMOS transistors 104, 105, 106, and 107, a current adjustment circuit 120, and a phase compensation circuit 130. The current adjustment circuit 120 includes a PMOS transistor 121 and NMOS transistors 122 and 123. The phase compensation circuit 130 includes a resistor 131, a capacitor 132, and an NMOS transistor 133. Here, the PMOS transistor 107 is a source output circuit of the error amplifier 100, and the NMOS transistor 109 is a sink output circuit of the error amplifier 100.

The reference voltage circuit 1 is connected between the input terminal 2 to which an input voltage $V_{IN}$ is applied and the reference terminal 4 to which a reference voltage $V_{SS}$ is applied, to provide a reference voltage $V_{REF}$ to a gate of the NMOS transistor 102 and to control the NMOS transistor 101 so that a constant flow of the first bias current $I_1$ is obtained. The output transistor 5 has a source connected to the input terminal 2, a gate connected to an output terminal N1 of the error amplifier 100, and a drain connected to the output terminal 3 and one terminal of the resistor 6, and provides an output voltage $V_{OUT}$ to the output terminal 3. The resistor 7 has one terminal connected to the other terminal of the resistor 6, and has the other terminal connected to the reference terminal 4. A connection point between the resistor 6 and the resistor 7, that is, a node N2, is connected to a gate of the NMOS transistor 103 and supplies the feedback voltage $V_{FB}$.

The NMOS transistor 101 has a drain connected to sources of the NMOS transistors 102 and 103, and a source connected to the reference terminal 4. The drain of the NMOS transistor 102 is connected to a gate and a drain of the PMOS transistor 104. The NMOS transistor 103 has a drain connected to a gate and a drain of the PMOS transistor 105. The PMOS transistor 104 has a source connected to the input terminal 2, and the gate of the PMOS transistor 104 is connected to a gate of the PMOS transistor 106. The PMOS transistor 105 has a source connected to the input terminal 2, and the gate of the PMOS transistor 105 is connected to a gate of the PMOS transistor 107.

The PMOS transistor 106 has a source connected to the input terminal 2, and a drain connected to a gate and a drain of the NMOS transistor 108 and the first terminal N3 of the phase compensation circuit 130. The NMOS transistor 108 has a source connected to the reference terminal 4. The PMOS transistor 107 has a source connected to the input terminal 2, and a drain connected to a drain of the NMOS transistor 109. The NMOS transistor 109 has a gate connected to the gate and the drain of the transistor 108, and a source connected to the reference terminal 4. A connection point between the drain of the PMOS transistor 107 and the drain of the NMOS transistor 109 is the output terminal N1 of the error amplifier 100.

The NMOS transistor 133 has a drain connected to one terminal of the resistor 131 and the first terminal N3, a gate connected to the other terminal of the resistor 131 and one terminal of the capacitor 132, and a source connected to the reference terminal 4. The other terminal of the capacitor 132 is connected to the second terminal N4 of the phase compensation circuit 130.

The PMOS transistor 121 has a source connected to the input terminal 2, and a gate connected to the output terminal N1. The NMOS transistor 122 has a drain and a gate connected to a drain of the PMOS transistor 121 and the second terminal N4 of the phase compensation circuit 130, and a source connected to the reference terminal 4. The NMOS transistor 123 has a drain connected to the sources of the NMOS transistors 102 and 103, a gate connected to the drain and the gate of the NMOS transistor 122, and a source connected to the reference terminal 4.

An operation of the voltage regulator 10 having such a configuration will be described below.

First, a basic output operation of the voltage regulator 10 will be described.

In a steady state, the error amplifier 100 performs a negative feedback control on the gate of the output transistor 5 so that the feedback voltage $V_{FB}$ coincides with the reference voltage $V_{REF}$. The output transistor 5 provides an output current $I_{OUT}$ for supplying a current to a load (not illustrated) connected to the output terminal 3. The output voltage $V_{OUT}$ of the output terminal 3 is controlled to be constant by the negative feedback control of the error amplifier 100 regardless of a magnitude of the output current $I_{OUT}$.

Inside the error amplifier 100, the NMOS transistors 102 and 103 constituting a differential pair are biased by the first bias current $I_1$ flowing through the NMOS transistor 101. An output current of the NMOS transistor 102 forming one of the differential pair flows to the phase compensation circuit 130 and the NMOS transistor 108 by a current mirror circuit including the PMOS transistors 104 and 106, and is further converted to a sink current and provided to the output terminal N1 via the NMOS transistor 109. An output current of the NMOS transistor 103 forming the other of the differential pair is converted to a source current by a current mirror circuit including the PMOS transistors 105 and 107 and output to the output terminal $N_1$. A voltage generated at the output terminal N1 is applied to the gate of the PMOS transistor 121, and the PMOS transistor 121 provides a sense current $I_S$ proportional to the output current $I_{OUT}$. Thus, a current mirror circuit including the NMOS transistors 122 and 123 operates so that a second bias current $I_2$ proportional to the sense current $I_S$ flows to the differential pair including the NMOS transistors 102 and 103.

Due to the configuration described above, when the output current $I_{OUT}$ is small, the current flowing through the error amplifier 100 becomes small and the voltage regulator 10 has low current consumption since the sense current $I_S$ and the second bias current $I_2$ which is proportional to the sense current $I_S$ also become small. On the other hand, when the output current $I_{OUT}$ is large, the slew rate of the error amplifier 100 becomes high, the bandwidth thereof becomes wide, and the gate of the output transistor 5 can thus be driven at high speed, thereby enhancing load transient response characteristics of the voltage regulator 10 since the sense current $I_S$ and the second bias current $I_2$ also become large, that is, both the source current flowing from the input terminal 2 to the output terminal N1 and the sink current flowing from the output terminal N1 to the reference terminal 4 become large. In the voltage regulator 10, it is thus possible to achieve both low current consumption and high load transient response characteristics by providing an adaptive bias mechanism.

Next, the phase compensation of the error amplifier 100 will be described.

The phase compensation circuit 130 cancels the change in sink output current caused by the change in the second bias current $I_2$ that flows due to the current adjustment circuit 120. That is, the phase compensation circuit 130 provides a signal obtained by inverting the phase of the change in the second bias current $I_2$ to the first terminal N3.

Here, when the feedback loop is disconnected at the output terminal N1, a path on which a signal is fed back to the output terminal N1 via the output transistor 5 defines the first feedback loop. Further, a path on which a signal is fed back to the output terminal N1 via the PMOS transistor 121 of the current adjustment circuit 120 defines the second feedback loop. Propagation signals of the first feedback loop and the second feedback loop coexist in the error amplifier 100 and are transferred to the output terminal N1.

When the second feedback loop is open, the sense current $I_S$ supplied from the PMOS transistor 121 decreases, the gate voltages of the NMOS transistors 122 and 123 decrease, and the second bias current $I_2$ decreases with respect to an input of a phase in which the voltage of the output terminal N1 increases. In this case, the source current supplied from the PMOS transistor 107, which also serves as a source output circuit, via the NMOS transistor 103 and the PMOS transistor 105 decreases, and the voltage at the output terminal N1 decreases. The second feedback loop via the source output circuit of the error amplifier 100 thus carries out a negative feedback.

On the other hand, since the drain current of the PMOS transistor 106 decreases via the NMOS transistors 122, 123, and 102 and the PMOS transistor 104 with respect to the input of the phase in which the voltage of the output terminal N1 increases, a current flowing through the NMOS transistor 108 decreases, that is, a current flowing through the NMOS transistor 109 also decreases, and the voltage of the output terminal N1 increases. Here, since the gate voltage of the NMOS transistor 122 and the gate voltage of the NMOS transistor 133 change in phase through the capacitor 132 at a frequency equal to or higher than the cutoff frequency of the phase compensation circuit 130, the gate voltage of the NMOS transistor 133 also decreases and a drain current of the NMOS transistor 133 decreases. The decrease in the drain current of the PMOS transistor 107 and the decrease in the drain current of the NMOS transistor 133 are canceled, and the decrease in the gate voltage of the NMOS transistor 109 is suppressed or the gate voltage is increased. As a result, since the decrease in the sink current supplied from the NMOS transistor 109, which also serves as a sink output circuit, is smaller than the decrease in the source current or the sink current increases, the voltage of the output terminal N1 becomes liable to decrease and the second feedback loop via the sink output circuit of the error amplifier 100 also carries out a negative feedback.

Although the input of the phase in which the voltage of the output terminal N1 increases has been described herein, the same can be applied to the input of the phase in which the voltage of the output terminal N1 decreases.

As described above, according to the voltage regulator 10 of the embodiment including the phase compensation circuit 130, the contribution of the positive feedback signal of the second feedback loop due to the current adjustment circuit is lowered or canceled. Stability of the operation can therefore be secured in the voltage regulator 10 even when a stabilization capacitor having a large capacitance is connected to the output terminal 3 and the gain of the first feedback loop is decreased.

In the configuration described above, it is preferable for a cutoff frequency $f_{CC1}$ at which the phase compensation circuit 130 becomes effective to be lower than a pole frequency $f_{p1}$ generated in the source output circuit of the first feedback loop. The cutoff frequency $f_{CC1}$ is approximately given by Equation (1) below through small signal analysis.

$$f_{CC1} = \frac{1}{2\pi R_1 C_1 \frac{g_{m133}}{g_{m133} + g_{m108}}} \quad (1)$$

Here, $R_1$ indicates a resistance of the resistor 131, $C_1$ indicates a capacitance of the capacitor 132, $g_{m133}$ indicates a transconductance of the NMOS transistor 133, and $g_{m108}$ indicates a transconductance of the NMOS transistor 108.

Further, in a general design, a main pole of the source output circuit serves as a pole of the gate of the PMOS transistor 107 due to a mirror effect between the gate and the drain of the PMOS transistor 107. The cutoff frequency $f_{CC1}$ may thus be set lower than the pole frequency of the gate of the PMOS transistor 107.

Figure 2:
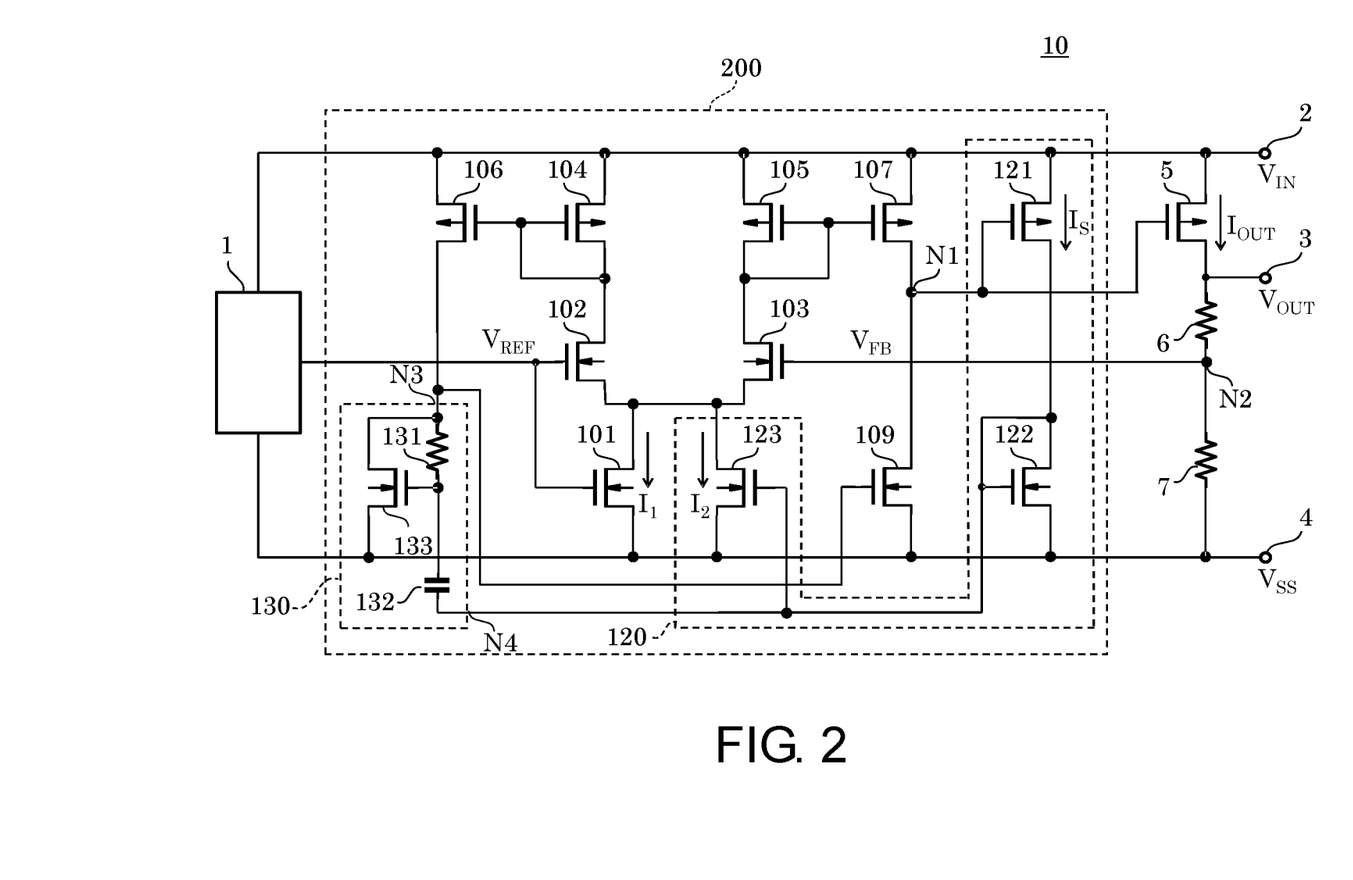
FIG. 2 is a circuit diagram illustrating another example of the voltage regulator of the embodiment.

FIG. 2 is a circuit diagram illustrating another example of the voltage regulator 10 of the embodiment. The same components as those of the voltage regulator 10 illustrated in FIG. 1 are denoted by the same reference numerals, and redundant description will be appropriately omitted.

In an error amplifier 200 of FIG. 2, the NMOS transistor 108 is eliminated from the error amplifier 100 of FIG. 1 so that the NMOS transistor 133 plays also a role of the NMOS transistor 108. The gate of the NMOS transistor 109 is therefore connected to the drain of the PMOS transistor 106. In the error amplifier 200, the current supplied from the PMOS transistor 106 only flows to the phase compensation circuit 130. In other respects, the basic output operation of the voltage regulator 10 and phase compensation of the error amplifier 200 are the same as those of the voltage regulator 10 of FIG. 1.

Further, the cutoff frequency $f_{CC2}$ at which the phase compensation circuit 130 becomes effective is approximately given by Equation (2) below through small signal analysis.

$$f_{CC2} = \frac{1}{2\pi R_1 C_1} \quad (2)$$

The cutoff frequency $f_{CC2}$ may be set lower than a pole frequency of the gate of the PMOS transistor 107, as in the voltage regulator 10 of FIG. 1.

Thus, according to the voltage regulator 10 of FIG. 2, it is possible to remove the NMOS transistor 108, in addition to the effect described in FIG. 1.

Figure 3:
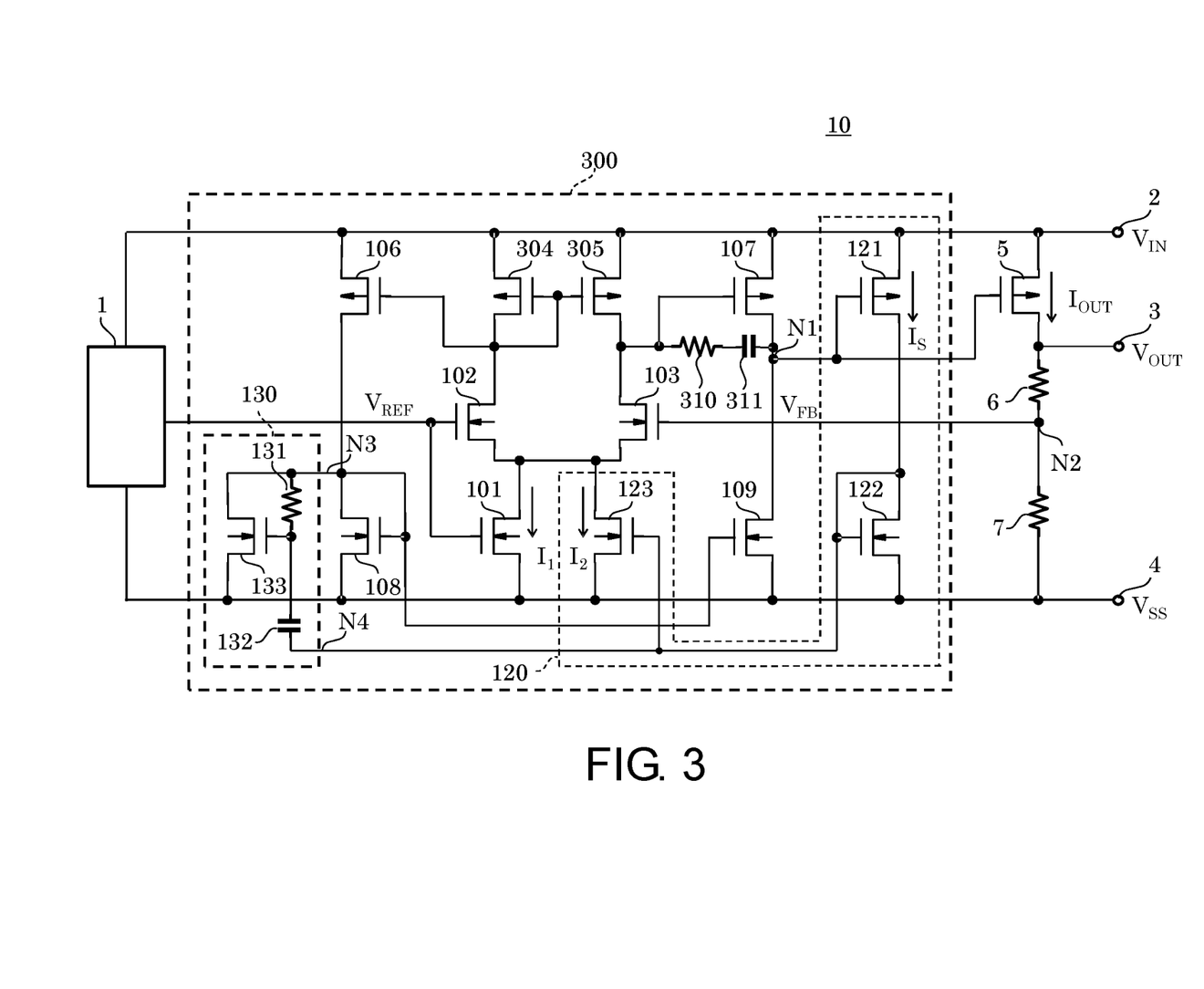
FIG. 3 is a circuit diagram illustrating another example of the voltage regulator of the embodiment.

FIG. 3 is a circuit diagram illustrating another example of the voltage regulator 10 of the embodiment. The same components as those of the voltage regulator 10 of FIG. 1 are denoted by the same reference numerals, and redundant description will be appropriately omitted.

An error amplifier 300 of the voltage regulator 10 of FIG. 3 differs from the error amplifier 100 of FIG. 1 in that active load circuits of the NMOS transistors 102 and 103 constituting the differential pair are replaced with PMOS transistors 304 and 305 constituting a current mirror circuit. Further, a resistor 310 and a capacitor 311 are provided between the gate and the drain of the PMOS transistor 107 constituting a source output circuit of the error amplifier 300.

A basic output operation and phase compensation of the voltage regulator 10 including the error amplifier 300 configured as illustrated in FIG. 3 are the same as those of the voltage regulator 10 of FIG. 1.

The voltage regulator 10 configured by the error amplifier 300 as illustrated in FIG. 3 can therefore obtain the same effect as the voltage regulator 10 in FIG. 1 by including the phase compensation circuit 130.

Figure 4:
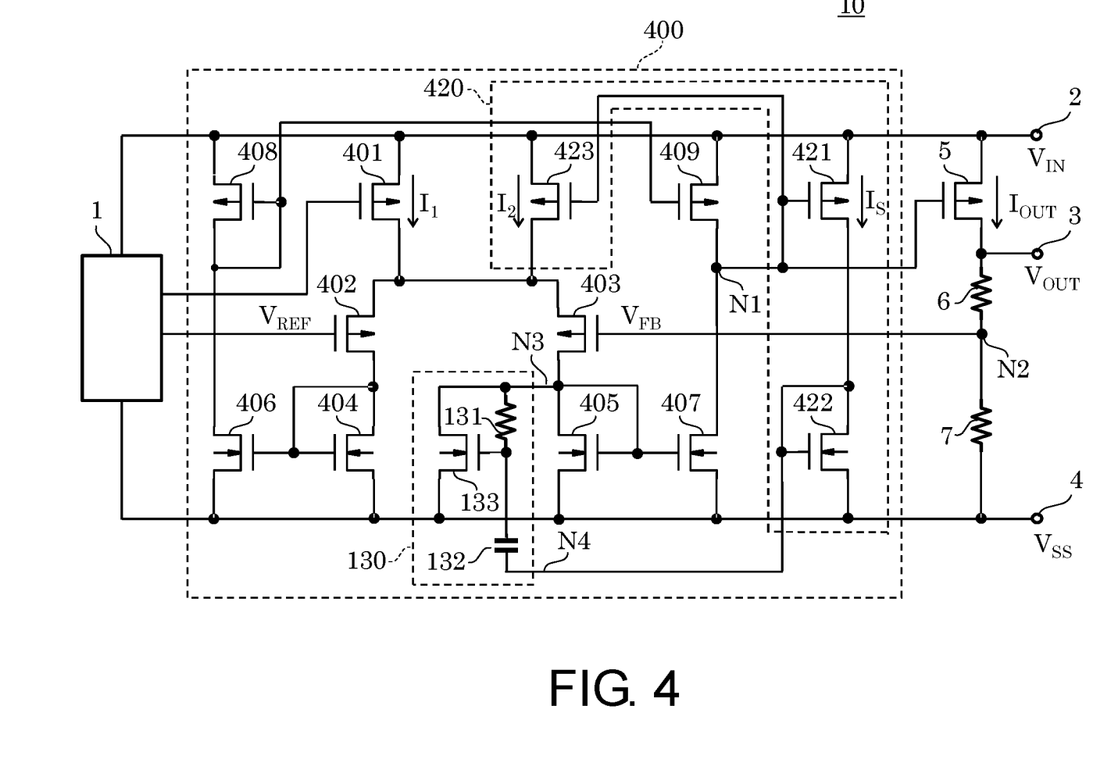
FIG. 4 is a circuit diagram illustrating another example of the voltage regulator of the embodiment.

FIG. 4 is a circuit diagram illustrating another example of the voltage regulator 10 of the embodiment. In addition, the same components as those of the voltage regulator 10 illustrated in FIG. 1 are denoted by the same reference numerals, and redundant description will be appropriately omitted.

The voltage regulator 10 of FIG. 4 includes an error amplifier 400. The error amplifier 400 includes PMOS transistors 401, 402, 403, 408, and 409, NMOS transistors 404, 405, 406, and 407, a current adjustment circuit 420, and a phase compensation circuit 130. The current adjustment circuit 420 includes PMOS transistors 421 and 423, and an NMOS transistor 422.

The PMOS transistor 401 is a current source which generates a constant first bias current $I_1$. The PMOS transistor 402 and the PMOS transistor 403 form an input differential pair of the error amplifier 400. The PMOS transistor 409 is a source output circuit of the error amplifier 400, and the NMOS transistor 407 is a sink output circuit of the error amplifier 400. That is, the error amplifier 400 is an error amplifier having a differential input stage of PMOS transistors, unlike the error amplifier 100 having the differential input stage of NMOS transistors.

In the phase compensation circuit 130, the first terminal N3 is connected to a drain of the PMOS transistor 403, and the second terminal N4 is connected to a gate and a drain of the NMOS transistor 422.

Since the basic operation of the voltage regulator 10 in FIG. 4 is the same as that of the voltage regulator 10 in FIG. 1, description thereof will be omitted.

Next, phase compensation of the error amplifier 400 will be described.

Here, when a feedback loop is disconnected at the output terminal N1 of the error amplifier 400, a path on which a signal is fed back to the output terminal N1 via an output transistor 5 defines the first feedback loop. Further, a path on which a signal is fed back to the output terminal N1 through the PMOS transistors 423 and 421 of the current adjustment circuit 420 in the error amplifier 400 defines the second feedback loop.

When the second feedback loop is open, the second bias current $I_2$ supplied from the PMOS transistor 423 becomes small with respect to an input of a phase in which a voltage of the output terminal N1 increases. In this case, a source current supplied from the PMOS transistor 409, which also serves as a source output circuit, via the PMOS transistor 402, the NMOS transistors 404 and 406, and the PMOS transistor 408 becomes small, and a voltage of the output terminal N1 decreases. The second feedback loop via the source output circuit of the error amplifier 400 thus carries out a negative feedback.

On the other hand, a drain current of the PMOS transistor 403 becomes small with respect to the input of the phase at which the voltage of the output terminal N1 increases. Further, a sense current $I_S$ output from the PMOS transistor 421 also decreases, and a gate voltage of the NMOS transistor 422 decreases. At this time, a gate voltage of the NMOS transistor 422 and a gate voltage of the NMOS transistor 133 change in phase via the capacitor 132 at a frequency equal to or higher than the cutoff frequency of the phase compensation circuit 130. Accordingly, the gate voltage of the NMOS transistor 133 also decreases, and the drain current of the NMOS transistor 133 becomes small. The decrease in the drain current of the PMOS transistor 403 and the decrease in the drain current of the NMOS transistor 133 are canceled, and the decrease in the gate voltage of the NMOS transistor 407 is suppressed or the drain current is increased. As a result, since the decrease in a sink current supplied from the NMOS transistor 407, which also serves as a sink output circuit, is smaller than the decrease in the source current or the sink current increases, the voltage of the output terminal N1 becomes liable to decrease. Thus, the second feedback loop via the sink output circuit of the error amplifier 400 also carries out a negative feedback.

Although the input of the phase in which the voltage of the output terminal N1 increases has been described herein, the same can be applied to the input of a phase in which the voltage of the output terminal N1 decreases.

In the configuration described above, a cutoff frequency $f_{CC3}$ at which the phase compensation circuit 130 becomes effective is approximately given by Equation (3) below through small signal analysis.

$$f_{CC3} = \frac{1}{2\pi R_1 C_1 \frac{g_{m133}}{g_{m133} + g_{m405}}} \quad (3)$$

Here, $R_1$ indicates a resistance of the resistor 131, $C_1$ indicates a capacitance of the capacitor 132, $g_{m133}$ indicates a transconductance of the NMOS transistor 133, and $g_{m405}$ indicates a transconductance of the NMOS transistor 405.

Further, in a general design, a main pole of the source output circuit serves as a pole of a gate of the PMOS transistor 409 due to a mirror effect between the gate and a drain of the PMOS transistor 409. It is thus preferable for the cutoff frequency $f_{CC3}$ to be set lower than the pole frequency of the gate of the PMOS transistor 409.

As described above, the voltage regulator 10 configured by the error amplifier 400 as illustrated in FIG. 4 can achieve the same effects as those of the voltage regulator 10 in the first embodiment by including the phase compensation circuit 130.

Figure 5:
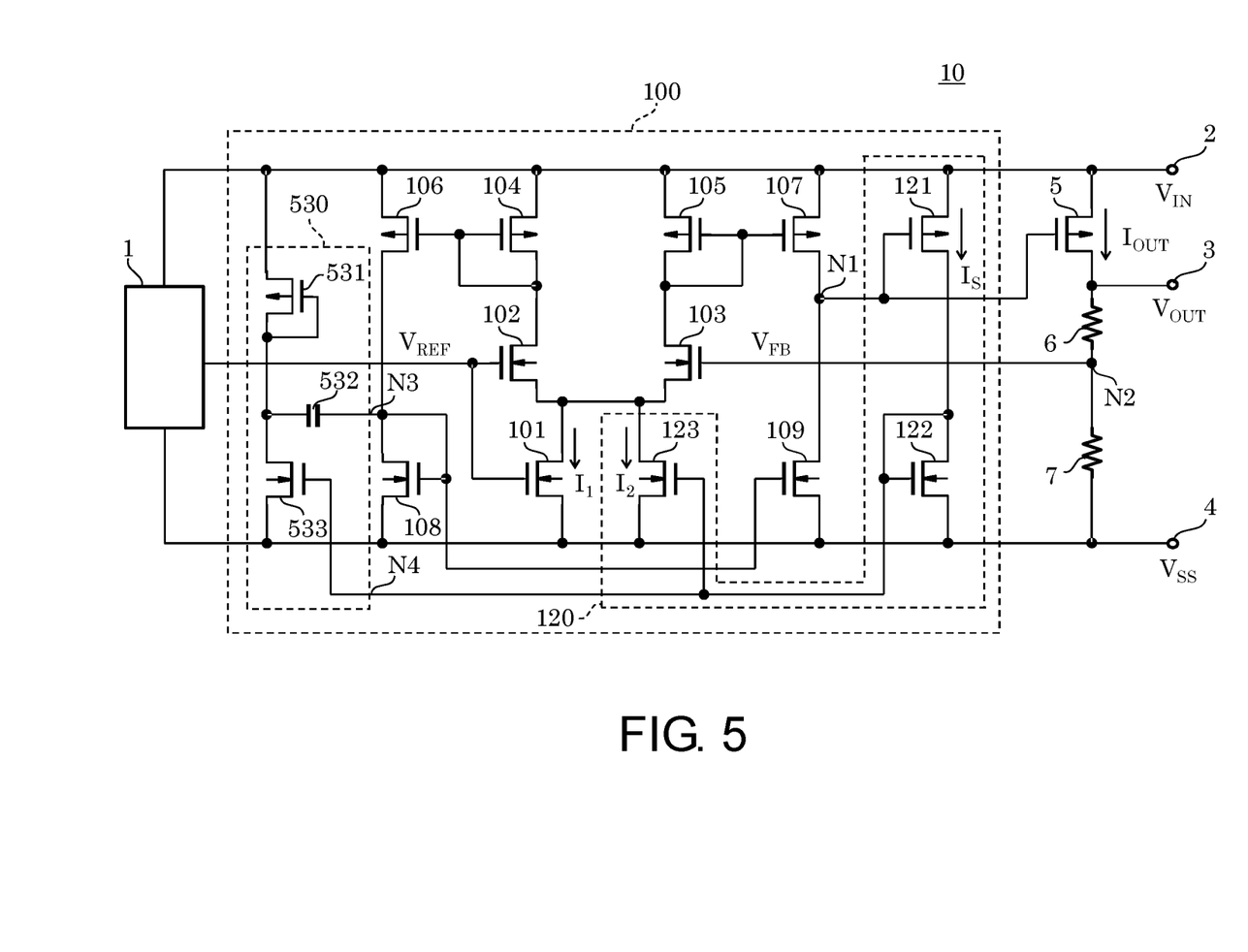
FIG. 5 is a circuit diagram illustrating another example of a phase compensation circuit.

FIG. 5 is a circuit diagram illustrating another example of the voltage regulator 10 of the embodiment. In addition, the same components as those of the voltage regulator 10 illustrated in FIG. 1 are denoted by the same reference numerals, and redundant description will be appropriately omitted.

A phase compensation circuit 530 includes a PMOS transistor 531, a capacitor 532, and an NMOS transistor 533.

The PMOS transistor 531 has a source connected to an input terminal 2, and a gate and a drain connected to one terminal of the capacitor 532. The other terminal of the capacitor 532 is connected to the first terminal N3 of the phase compensation circuit 530. The NMOS transistor 533 has a drain connected to the one terminal of the capacitor 532, a gate connected to the second terminal N4 of the phase compensation circuit 530, and a source connected to the reference terminal 4.

A specific operation of the phase compensation circuit 530 will be described below. When a voltage at the output terminal N1 of the error amplifier 100 decreases and a sense current $I_S$ increases, a current of the PMOS transistor 106 increases via the NMOS transistor 102 and the PMOS transistor 104 because the current adjustment circuit 120 increases a second bias current $I_2$.

On the other hand, as the sense current $I_S$ increases, gate voltages of the NMOS transistor 122 and the NMOS transistor 533 increase, and a drain current of the NMOS transistor 533 increases. Since the drain voltage of the NMOS transistor 533 thus decreases, in the capacitor 532 a current flows from the first terminal N3 to the drain of the NMOS transistor 533.

Since the increase in the current of the PMOS transistor 106 is thus canceled by the current of the capacitor 532, an increase in the gate voltage of the NMOS transistor 109 is suppressed or the gate voltage is decreased. As a result, an increase in the sink current supplied from the NMOS transistor 109 is smaller than the increase of the source current, or the sink current decreases. That is, the second feedback loop of the error amplifier carries out a negative feedback.

As described above, the phase compensation circuit 530 can obtain the same effects as those of the phase compensation circuit 130.

The embodiment of the present invention has been described above, but the present invention is not limited to the above embodiment, and it is obvious that various modifications or combinations are possible without departing from the gist of the present invention.

For example, the phase compensation circuit 130 can be configured to connect a resistor in series with the capacitor 132 in order to adjust the gain. Furthermore, the configuration of the phase compensation circuit 130 is not limited as long as the phase compensation circuit 130 has the function described in the embodiment. Further, for example, a configuration in which a current mirror circuit that causes a current obtained by adding the first bias current and the second bias current to flow is provided and the added bias current flows to the differential pair of the error amplifier may be adopted, instead of connecting the transistor that causes the first bias current to flow and the transistor that causes the second bias current to flow in parallel in the error amplifier.

What is claimed is:

1. A voltage regulator, comprising:
    an error amplifier configured to control an output transistor so that a feedback voltage based on an output voltage is consistent with a reference voltage, and comprising:
        a differential pair constituted from a pair of transistors;
        a current adjustment circuit configured to provide a bias current to the differential pair in which the bias current is proportional to an output current provided from the output transistor;
        a source output circuit and a sink output circuit configured to provide a current based on a current flowing through the differential pair to an output terminal of the error amplifier; and
        a phase compensation circuit having a first terminal connected to the sink output circuit and a second terminal connected to the current adjustment circuit, the phase compensation circuit controlling a current of the sink output circuit based on a current of the current adjustment circuit.

2. The voltage regulator according to claim 1, wherein the phase compensation circuit comprises:
    a resistor having one terminal connected to the first terminal;
    a capacitor having one terminal connected to the other terminal of the resistor, and the other terminal connected to the second terminal; and
    a transistor having a drain connected to the one terminal of the resistor, a gate connected to the other terminal of the resistor, and a source connected to a reference terminal.

3. The voltage regulator according to claim 1, wherein the phase compensation circuit comprises:
    a first transistor having a source connected to an input terminal, and a gate and a drain connected to each other;
    a capacitor having one terminal connected to the first terminal, and the other terminal connected to the gate and the drain of the first transistor; and
    a second transistor having a drain connected to the other terminal of the capacitor, a gate connected to the second terminal, and a source connected to a reference terminal.

* * * * *